(12) United States Patent
Wang et al.

(10) Patent No.: US 10,116,290 B1
(45) Date of Patent: Oct. 30, 2018

(54) RF FRONTEND HAVING A WIDEBAND MM WAVE FREQUENCY DOUBLER

(71) Applicant: SPEED WIRELESS TECHNOLOGY INC., San Jose, CA (US)

(72) Inventors: Hua Wang, Atlanta, GA (US); Taiyun Chi, Atlanta, GA (US); Sensen Li, Atlanta, GA (US); Thomas Chen, Vancouver (CA)

(73) Assignees: SPEEDLINK TECHNOLOGY INC., Cupertino, CA (US); GEORGIA TECH RESEARCH CORPORATION, Atlanta, GA (US)

( * ) Notice: Subject to any disclaimer, the term of this patent is extended or adjusted under 35 U.S.C. 154(b) by 0 days.

(21) Appl. No.: 15/835,355

(22) Filed: Dec. 7, 2017

(51) Int. Cl.
| | |
|---|---|
| *H04B 1/40* | (2015.01) |
| *H03K 5/04* | (2006.01) |
| *H03K 17/687* | (2006.01) |
| *H03K 5/00* | (2006.01) |
| *H03H 7/38* | (2006.01) |
| *H03L 7/093* | (2006.01) |
| *H04B 1/403* | (2015.01) |

(52) U.S. Cl.
CPC ............ *H03K 5/04* (2013.01); *H03H 7/38* (2013.01); *H03K 5/00006* (2013.01); *H03K 17/687* (2013.01); *H03L 7/093* (2013.01); *H04B 1/40* (2013.01); *H04B 1/403* (2013.01)

(58) Field of Classification Search
CPC .................................. H04B 1/40; H04B 1/403
USPC ...................................................... 455/73, 76
See application file for complete search history.

(56) References Cited

U.S. PATENT DOCUMENTS

| | | | | |
|---|---|---|---|---|
| 5,890,051 | A * | 3/1999 | Schlang ............... | H03D 7/163 455/76 |
| 6,417,737 | B1 * | 7/2002 | Moloudi ............... | H03B 21/01 330/301 |
| 7,558,556 | B1 * | 7/2009 | Moloudi ............... | H04B 1/40 323/267 |
| 2005/0048993 | A1 * | 3/2005 | Ammar ................. | H04B 1/18 455/502 |
| 2005/0186917 | A1 * | 8/2005 | Rofougaran .......... | H03F 3/245 455/73 |
| 2008/0055008 | A1 * | 3/2008 | Staszewski .......... | H03B 21/00 331/37 |
| 2008/0055009 | A1 * | 3/2008 | Lerner ................. | H03B 21/00 331/37 |
| 2008/0055010 | A1 * | 3/2008 | Lerner ................. | H03B 21/02 331/37 |

(Continued)

*Primary Examiner* — April G Gonzales
(74) *Attorney, Agent, or Firm* — Womble Bond Dickinson (US) LLP

(57) ABSTRACT

According to one embodiment, a frequency doubler circuit includes a first field effect transistor (FET) having a first gate, a first source, and a first drain and a second FET having a second gate, a second source, and a second drain, where the first gate of the first FET and the second source of the second FET are driven by an input signal in a first phase, and the first source of the first FET and the second gate of the second FET are driven by the input signal in a second phase, where the first and the second FETs are caused to switch based on the first phase and the second phase of the input signal respectively to generate an output signal at the first drain and the second drain having a frequency that is approximately double of the input signal.

20 Claims, 13 Drawing Sheets

100

(56) References Cited

U.S. PATENT DOCUMENTS

| | | | |
|---|---|---|---|
| 2008/0055014 A1* | 3/2008 | Tsfaty | H03B 19/00 332/127 |
| 2008/0056337 A1* | 3/2008 | Tal | H03B 21/02 375/219 |
| 2010/0039153 A1* | 2/2010 | Qiao | H03K 23/42 327/254 |
| 2011/0136443 A1* | 6/2011 | Milenkovic | G06F 1/0255 455/76 |
| 2014/0266471 A1* | 9/2014 | Zhu | H03L 7/00 331/16 |

* cited by examiner

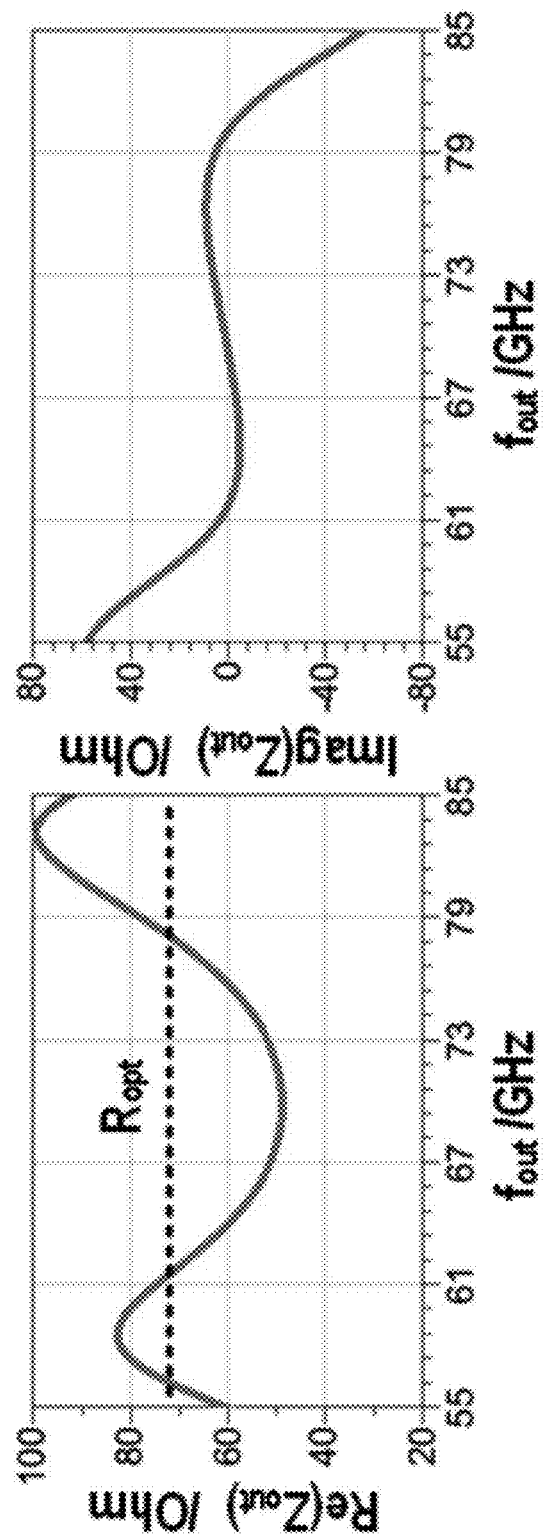

RF FRONTEND HAVING A WIDEBAND MM WAVE FREQUENCY DOUBLER

FIELD OF THE INVENTION

Embodiments of the present invention relate generally to wireless communication devices. More particularly, embodiments of the invention relate to a frequency doubler circuit of a wireless communication device.

BACKGROUND

Silicon integrated circuits designed for wireless communication and radar applications at millimeter (mm)-wave frequencies demand signal sources with high spectral purity. However, as the operation frequency increases, the implementation of low phase-noise oscillators becomes challenging. One possible solution is to utilize a frequency multiplier that up-converts its input driving source at a much lower frequency, where voltage-controlled oscillator (VCO) and phase-locked loop (PLL) with high spectral purity can be readily generated on chip.

Moreover, mm-wave signal sources generally require sufficient output power to serve as the local oscillator (LO) for frequency-translation circuits to drive the following power amplifiers. However, high power generation and efficient signal amplification are challenging at mm-wave due to limited transistor cut-off frequency fmax and breakdown voltage in low-cost silicon processes. Therefore, conventional mm-wave frequency multipliers often suffer from high conversion loss, low direct current (DC) to radio frequency (RF) energy transfer efficiency, and limited output power.

BRIEF DESCRIPTION OF THE DRAWINGS

Embodiments of the invention are illustrated by way of example and not limitation in the figures of the accompanying drawings in which like references indicate similar elements.

FIGS. 7B and 7C are exemplary real and imaginary impedance graphs of the output matching network (as seen by the frequency double output) of FIG. 7A.

DETAILED DESCRIPTION

Figure 1:
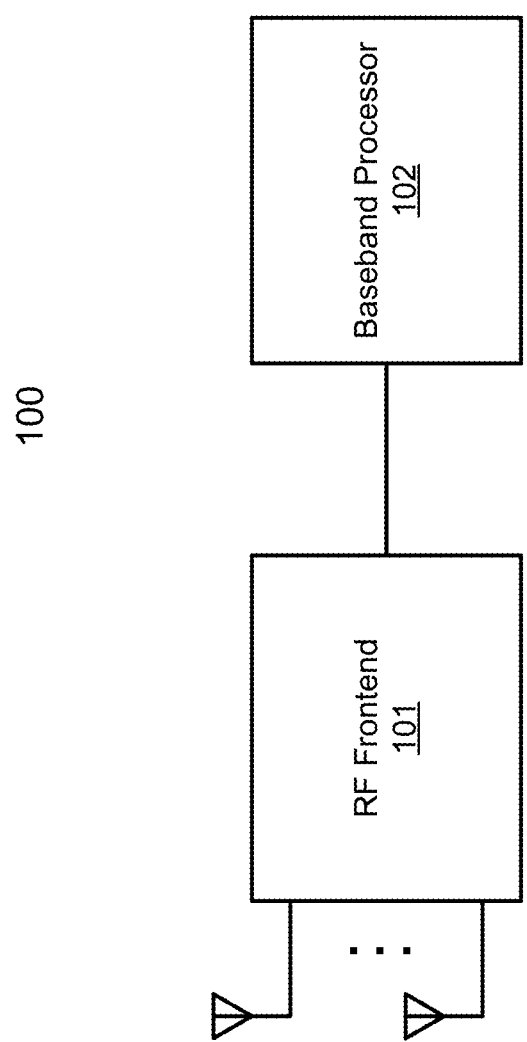
FIG. 1 is a block diagram illustrating an example of a wireless communication device according one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, a frequency doubler circuit includes a first field effect transistor (FET) having a first gate, a first source, and a first drain and a second FET having a second gate, a second source, and a second drain, where the first gate of the first FET and the second source of the second FET are driven by an input signal in a first phase, and the first source of the first FET and the second gate of the second FET are driven by the input signal in a second phase, where the first and the second FETs are caused to switch based on the first phase and the second phase of the input signal respectively to generate an output signal at the first drain and the second drain having a frequency that is approximately double of the input signal.

In one embodiment, the first and the second phases are approximately 180 degrees out of phase. In one embodiment, the frequency doubler circuit further includes an input matching network coupled to the first and the second field effect transistors. The input matching network includes a first transformer having a primary and a secondary windings. The primary winding is coupled to an input port of the frequency doubler circuit, a first end of the secondary winding is coupled to the first gate of the first field effect transistor and the second source of the second field effect transistor, and a second end of the secondary winding is coupled to the first source of the first field effect transistor and the second gate of the second field effect transistor. The input matching network includes a first capacitance coupled to a center tap of the secondary winding of the first transformer and configured to induce a first resonant frequency with a common-mode inductance of the first transformer. In another embodiment, the input matching network comprises an inductance-capacitance network coupled to the secondary winding of the first transformer and configured to induce a second resonant frequency, where the first and the second resonant frequencies forms an operating bandwidth of the frequency doubler circuit.

In one embodiment, the frequency doubler circuit further includes an output matching network coupled to the first and the second drains of the first and the second field effect transistors respectively. In another embodiment, the output matching network includes a second transformer having a primary and a secondary windings, where the primary winding is coupled between a DC biasing source and the first and the second drains of the first and the second field effect transistors, respectively, and the secondary winding is coupled to an output port via a fourth capacitance. The output matching network can include a fifth capacitance in parallel to the secondary winding of the second transformer.

According to some embodiments, an RF frontend integrated circuit (IC) device includes a RF transceiver to transmit and receive RF signals, a frequency synthesizer coupled to the RF transceiver to perform frequency synthesis. The frequency synthesizer includes a local oscillator (LO) to generate a LO signal and a frequency doubler circuit coupled to the LO to double a frequency of the LO signal. The frequency doubler circuit includes a first field effect transistor having a first gate, a first source, and a first drain and a second field effect transistor having a second gate, a second source, and a second drain, where the first gate of the first field effect transistor and the second source of the second field effect transistor are driven by an input signal in a first phase, and the first source of the first field effect transistor and the second gate of the second field effect transistor are driven by the input signal in a second phase. The first field effect transistor and the second field effect transistor are caused to switch based on the first phase and the second phase of the input signal respectively to generate an output signal at the first drain and the second drain having a frequency that is approximately double of the input signal.

According to some embodiments, a wireless communication device includes an RF IC (e.g., an RF frontend IC) and a baseband processor. The RF frontend IC includes a RF transceiver to transmit and receive RF signals, and a frequency synthesizer coupled to the RF transceiver to perform frequency synthesis. The frequency synthesizer includes a local oscillator (LO) to generate a LO signal and a frequency doubler circuit coupled to the LO to double a frequency of the LO signal. The frequency doubler circuit includes a first field effect transistor having a first gate, a first source, and a first drain and a second field effect transistor having a second gate, a second source, and a second drain, where the first gate of the first field effect transistor and the second source of the second field effect transistor are driven by an input signal in a first phase, and the first source of the first field effect transistor and the second gate of the second field effect transistor are driven by the input signal in a second phase. The first field effect transistor and the second field effect transistor are caused to switch based on the first phase and the second phase of the input signal respectively to generate an output signal at the first drain and the second drain having a frequency that is approximately double of the input signal.

FIG. 1 is a block diagram illustrating an example of a wireless communication device according one embodiment of the invention. Referring to FIG. 1, wireless communication device 100, also simply referred to as a wireless device, includes, amongst others, an RF frontend module 101 and a baseband processor 102. Wireless device 100 can be any kind of wireless communication devices such as, for example, mobile phones, laptops, tablets, network appliance devices (e.g., Internet of thing or TOT appliance devices), etc.

In a radio receiver circuit, the RF frontend is a generic term for all the circuitry between the antenna up to and including the mixer stage. It consists of all the components in the receiver that process the signal at the original incoming radio frequency, before it is converted to a lower intermediate frequency (IF). In microwave and satellite receivers it is often called the low-noise block (LNB) or low-noise downconverter (LND) and is often located at the antenna, so that the signal from the antenna can be transferred to the rest of the receiver at the more easily handled intermediate frequency. A baseband processor is a device (a chip or part of a chip) in a network interface that manages all the radio functions (all functions that require an antenna).

In one embodiment, RF frontend module 101 includes one or more RF transceivers, where each of the RF transceivers transmits and receives RF signals within a particular frequency band (e.g., a particular range of frequencies such as non-overlapped frequency ranges) via one of a number of RF antennas. The RF frontend IC chip further includes a frequency synthesizer coupled to the RF transceivers. The frequency synthesizer generates and provides a local oscillator (LO) signal to each of the RF transceivers to enable the RF transceiver to mix, modulate, and/or demodulate RF signals within a corresponding frequency band. The RF transceivers and the frequency synthesizer may be integrated within a single IC chip as a single RF frontend IC chip or package.

Figure 2:
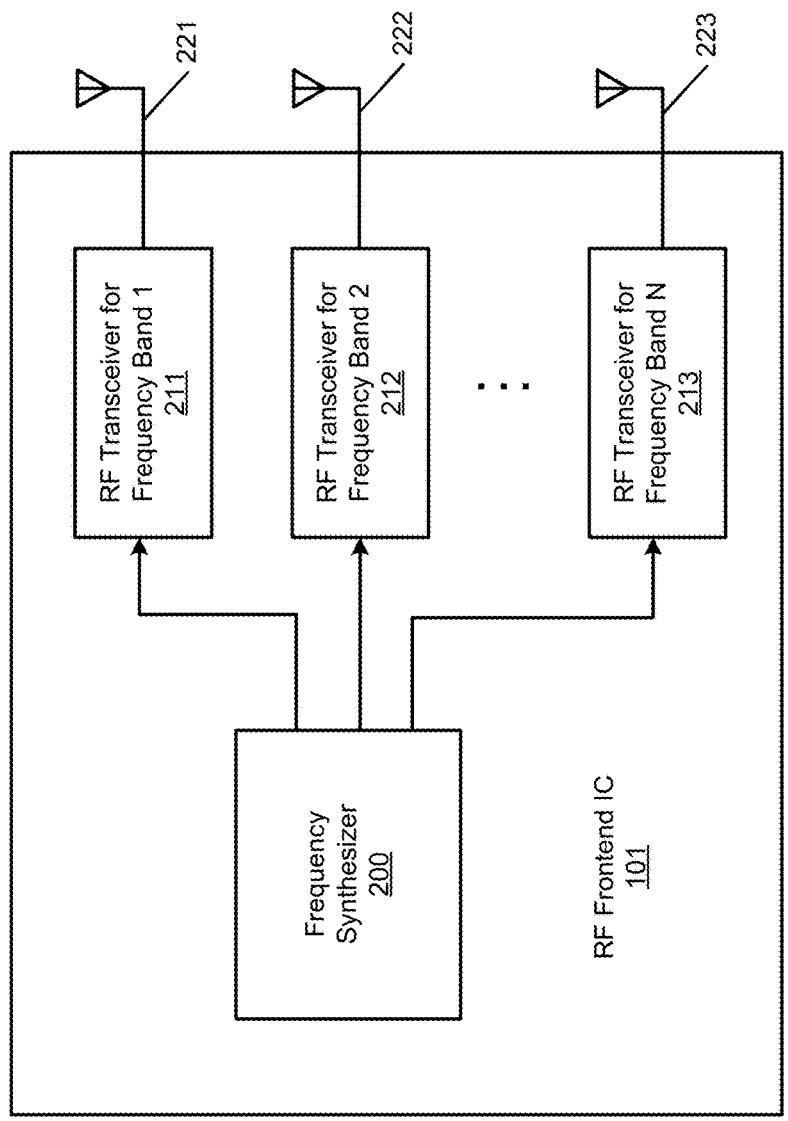
FIG. 2 is a block diagram illustrating an example of an RF frontend integrated circuit according to one embodiment.

FIG. 2 is a block diagram illustrating an example of an RF frontend integrated circuit according to one embodiment of the invention. Referring to FIG. 2, RF frontend 101 includes, amongst others, a frequency synthesizer 200 coupled to one or more RF transceivers 211-213. Each of transceivers 211-213 is configured to transmit and receive RF signals within a particular frequency band or a particular range of RF frequencies via one of RF antennas 221-223. In one embodiment, each of transceivers 211-213 is configured to receive a LO signal from frequency synthesizer 200. The LO signal is generated for the corresponding frequency band. The LO signal is utilized to mix, modulate, demodulated by the transceiver for the purpose of transmitting and receiving RF signals within the corresponding frequency band.

Figure 3A:
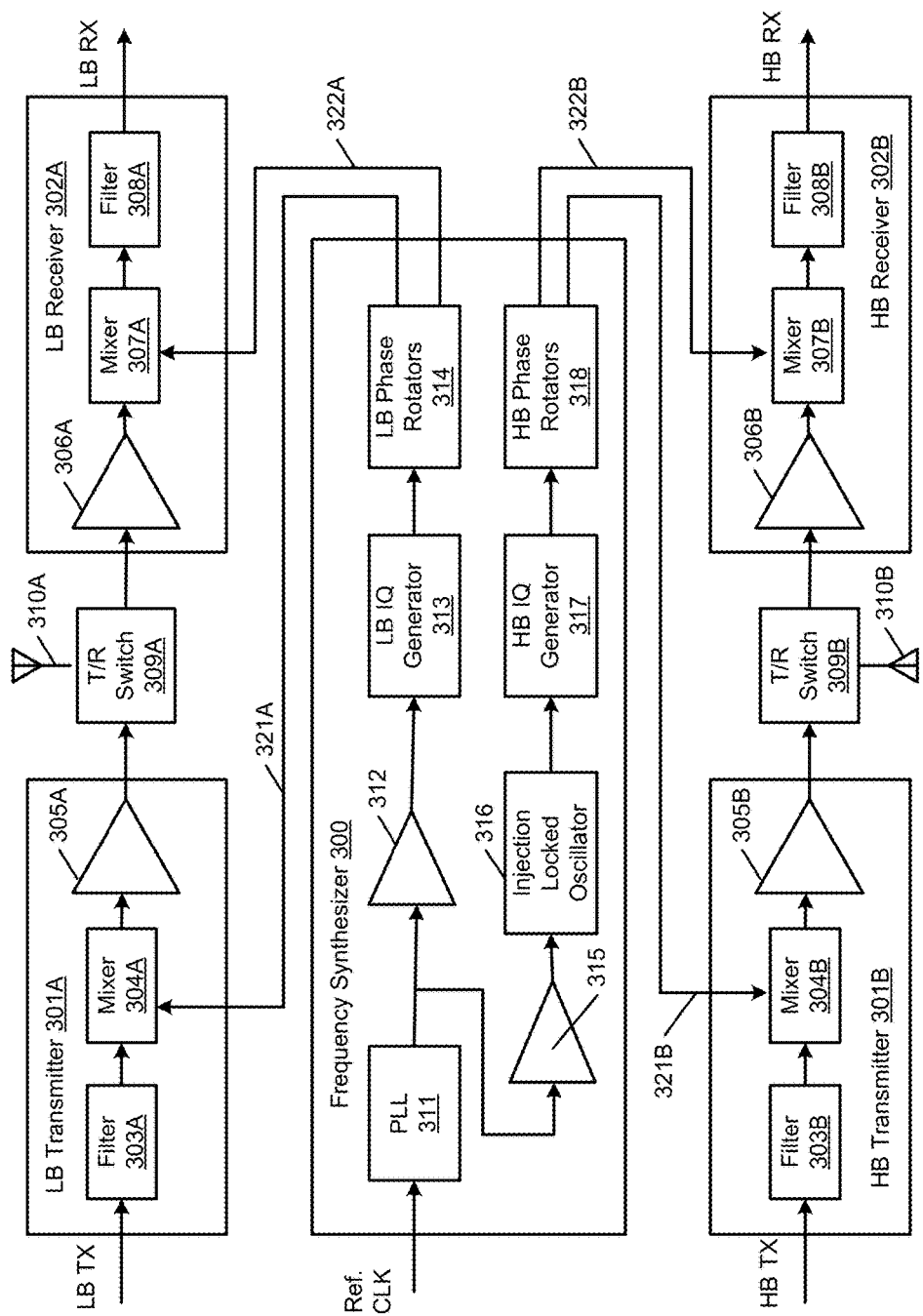
FIG. 3A is a block diagram illustrating an RF frontend integrated circuit according to another embodiment.

FIG. 3A is a block diagram illustrating an RF frontend integrated circuit according to another embodiment of the invention. Referring to FIG. 3A, frequency synthesizer 300 may represent frequency synthesizer 101 as described above. In one embodiment, frequency synthesizer 300 is communicatively coupled to an array of transceivers, each transceiver corresponding to one of a number of frequency bands. In this example, frequency synthesizer 300 is coupled to transmitter 301A, receiver 302A, transmitter 301B, and receiver 302B. Transmitter 301A and receiver 302A may be a part of a first transceiver operating in a lower frequency band, referred to as a low-band (LB) transmitter and LB receiver. Transmitter 301B and receiver 302B may be a part of a second transceiver operating in a higher frequency band, referred to as a high-band (HB) transmitter and HB receiver. Note that although there are only two transceivers as shown in FIG. 3A, more or fewer transceivers may also be coupled to frequency synthesizer 300 as shown in FIG. 2.

In one embodiment, frequency synthesizer 300 includes, but is not limited to, phase-lock loop (PLL) circuitry or block 311, a LO buffer 312, LB in-phase/quadrature (IQ) generator 313, and LB phase rotators 314. A PLL is a control system that generates an output signal whose phase is related to the phase of an input signal. While there are several differing types, it is easy to initially visualize as an electronic circuit consisting of a variable frequency oscillator and a phase detector. The oscillator generates a periodic signal, and the phase detector compares the phase of that signal with the phase of the input periodic signal, adjusting the oscillator to keep the phases matched. Bringing the output signal back toward the input signal for comparison is called a feedback loop since the output is "fed back" toward the input forming a loop.

Keeping the input and output phase in lock step also implies keeping the input and output frequencies the same. Consequently, in addition to synchronizing signals, a phase-locked loop can track an input frequency, or it can generate a frequency that is a multiple of the input frequency. These properties are used for clock synchronization, demodulation, and frequency synthesis. Phase-locked loops are widely employed in radio, telecommunications, computers and other electronic applications. They can be used to demodulate a signal, recover a signal from a noisy communication channel, generate a stable frequency at multiples of an input frequency (frequency synthesis), or distribute precisely timed clock pulses in digital logic circuits such as microprocessors.

Referring back to FIG. 3A, PLL block 311 is to receive a clock reference signal and to lock onto the frequency of the clock reference signal to generate a first LO signal, i.e., a low-band LO signal or LBLO signal. The first LO signal may be optionally buffered by a LO buffer 312. Based on the LBLO signal, LB IQ generator 313 generates IQ signals that are suitable for mixing, modulating, and demodulating in-phase and quadrature components of RF signals. The IQ signals may be rotated by a predetermined angle or delayed by LB phase rotators 314. The rotated IQ signals are then provided to LB transmitter 301A and receiver 302A. Particularly, the IQ signals may include transmitting IQ (TXIQ) signals 321A to be provided to LB transmitter 301A and in-phase and quadrature receiving IQ (RXIQ) signals 322A to be provided to LB receiver 302A.

In one embodiment, frequency synthesizer 300 further includes a frequency converter 315, injection locked oscillator 316, HB IQ generator 317, and HB phase rotators 318. Frequency converter 315 is to convert the first LO signal generated from the PLL block 311 to a signal with higher frequency (e.g., within a higher frequency band). In one embodiment, frequency converter 315 includes a frequency doubler to double the frequency of the first LO signal. Injection locked oscillator 316 is to lock onto the doubled-frequency signal received from frequency converter 315 to generator the second LO signal having the second LO frequency approximately twice as the first LO frequency. Note that in this example, the second LO frequency is twice as the first LO frequency. However, frequency converter 315 can convert and generate a frequency in any frequency range. If there are more frequency bands to be integrated within the RF frontend device, more frequency converters may be utilized to convert a reference frequency to a number of other lower or higher frequencies.

Injection locking and injection pulling are the frequency effects that can occur when a harmonic oscillator is disturbed by a second oscillator operating at a nearby frequency. When the coupling is strong enough and the frequencies near enough, the second oscillator can capture the first oscillator, causing it to have essentially identical frequency as the second. This is injection locking. When the second oscillator merely disturbs the first but does not capture it, the effect is called injection pulling. Injection locking and pulling effects are observed in numerous types of physical systems, however the terms are most often associated with electronic oscillators or laser resonators.

Referring back to FIG. 3A, HB IQ generator 317 generates IQ signals that are suitable for mixing, modulating, and demodulating in-phase and quadrature components of RF signals in a high band frequency range. In electrical engineering, a sinusoid with angle modulation can be decomposed into, or synthesized from, two amplitude-modulated sinusoids that are offset in phase by one-quarter cycle ($\pi/2$ radians). All three functions have the same frequency. The amplitude modulated sinusoids are known as in-phase and quadrature components. Some people find it more convenient to refer to only the amplitude modulation (baseband) itself by those terms.

The IQ signals may be rotated by a predetermined angle or delayed by HB phase rotators 318. The rotated IQ signals are then provided to HB transmitter 301B and receiver 302B. Particularly, the IQ signals may include transmitting IQ (TXIQ) signals 321B to be provided to HB transmitter 301B and in-phase and quadrature receiving IQ (RXIQ) signals 322B to be provided to HB receiver 302B. Thus, components 312-314 are configured to generate TXIQ and RXIQ signals for LB transmitter 301A and LB receiver 302A, while components 315-318 are configured to generate TXIQ and RXIQ signals for HB transmitter 301B and HB receiver 302B. If there are more transmitters and receivers of more frequency bands involved, more sets of components 312-314 and/or components 315-318 may be maintained by frequency synthesizer 300 for generating the necessary TXIQ and RXIQ signals for the additional frequency bands.

In one embodiment, LB transmitter 301A includes a filter 303A, a mixer 304A, and an amplifier 305A. Filter 303A may be a low-pass (LP) filter that receives LB transmitting (LBTX) signals to be transmitted to a destination, where the LBTX signals may be provided from a baseband processor such as baseband processor 102. Mixer 301A (also referred to as an up-convert mixer or an LB up-convert mixer)) is configured to mix and modulate the LBTX signals onto a carrier frequency signal based on TXIQ signal provided by LB phase rotators 314. The modulated signals (e.g., low-band RF or LBRF signals) are then amplified by amplifier 305A and the amplified signals are then transmitted to a remote receiver via antenna 310A.

In one embodiment, LB receiver 302A includes an amplifier 306A, mixer 307A, and filter 308A. Amplifier 306A is to receive LBRF signals from a remote transmitter via antenna 310A and to amplify the received RF signals. The amplified RF signals are then demodulated by mixer 307A (also referred to as a down-convert mixer or an LB down-convert mixer) based on RXIQ signal received from LB phase rotators 314. The demodulated signals are then processed by filter 308A, which may be a low-pass filter. In one embodiment, LB transmitter 301A and LB receiver 302A share antenna 310A via a transmitting and receiving (T/R) switch 309A. T/R switch 309A is configured to switch between LB transmitter 301A and receiver 302A to couple antenna 310A to either LB transmitter 301A or LB receiver 302A at a particular point in time.

Similarly, HB transmitter 301B includes filter 303B, mixer 304B (also referred to as a HB up-convert mixer), and amplifier 305B having functionalities similar to filter 303A, mixer 304A, and amplifier 305A of LB transmitter 301A, respectively, for processing high-band transmitting (HBTX) signals. HB receiver 302B includes filter 306B, mixer 307B (also referred to as a HB down-convert mixer), and filter 308B having functionalities similar to amplifier 306A, mixer 307A, and filter 308A of LB receiver 302A, respectively, for processing high-band receiving (HBRX) signals. HB transmitter 301B and HB receiver 302B are coupled to antenna 310B via T/R switch 309B similar to the configuration of LB transmitter 301A and receiver 302A.

Figure 3B:
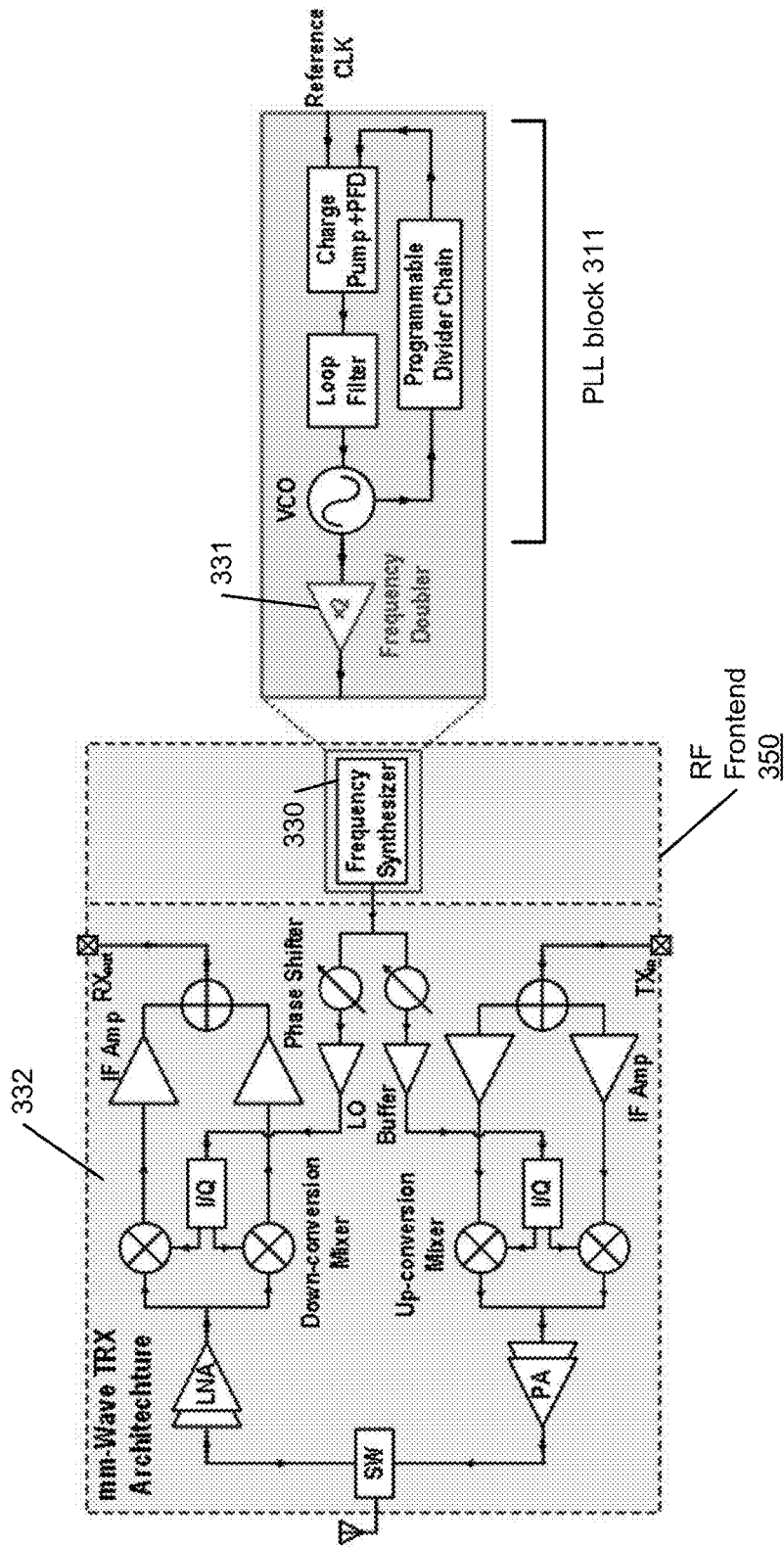
FIG. 3B is a block diagram illustrating an RF frontend integrated circuit according to another embodiment.

FIG. 3B is a block diagram illustrating an RF frontend integrated circuit according to another embodiment of the invention. Referring to FIG. 3B, RF frontend integrated circuit 350 includes a transceiver 332 and a frequency synthesizer 330. Frequency synthesizer 330 may represent frequency synthesizer 200 of FIG. 2. Frequency synthesizer 330 is communicatively coupled to transceiver 332 to generate and provide a local oscillator (LO) signal to RF transceiver 332 to enable RF transceiver 332 to mix, modulate, and/or demodulate RF signals within a corresponding frequency band. Transceiver 332 is configured to transmit and receive RF signals within a particular frequency band or a particular range of RF frequencies via one or more RF antennas. In one embodiment, frequency synthesizer 330 is to convert a signal generated from PLL block 311 to a signal with higher frequency. In one embodiment, frequency synthesizer 330 includes frequency doubler 331 to double the frequency of a signal generated by PLL block 311. Note that although only one transceiver is shown in FIG. 3B, RF frontend IC 350 can include one or more transceivers coupled to frequency synthesizer 330 as shown in FIG. 2.

In this example, RF frontend 332 includes an RF transmitter and an RF receiver. The RF transmitter includes an input to receive a signal in an intermediate frequency (IF), referred to herein as a TX signal. The TX signal is amplified by an IF amplifier and up-converted into an RF signal using an up-conversion mixer based on a LO signal provided by frequency synthesizer 330. The RF signal is then amplified by a power amplifier (PA). The amplified RF signal is then transmitted via an antenna. The RF receiver includes a low noise amplifier (LNA) to amplify an RF signal received via the antenna. The received RF signal is then down-converted into an IF signal using a down-conversion mixer using the LO signal provided by frequency synthesizer 330. The IF signal is then amplified using an IF amplifier. The amplified IF signal, referred to herein as an RX signal, is then transmitted to an output of RF frontend module 350.

Figure 4:
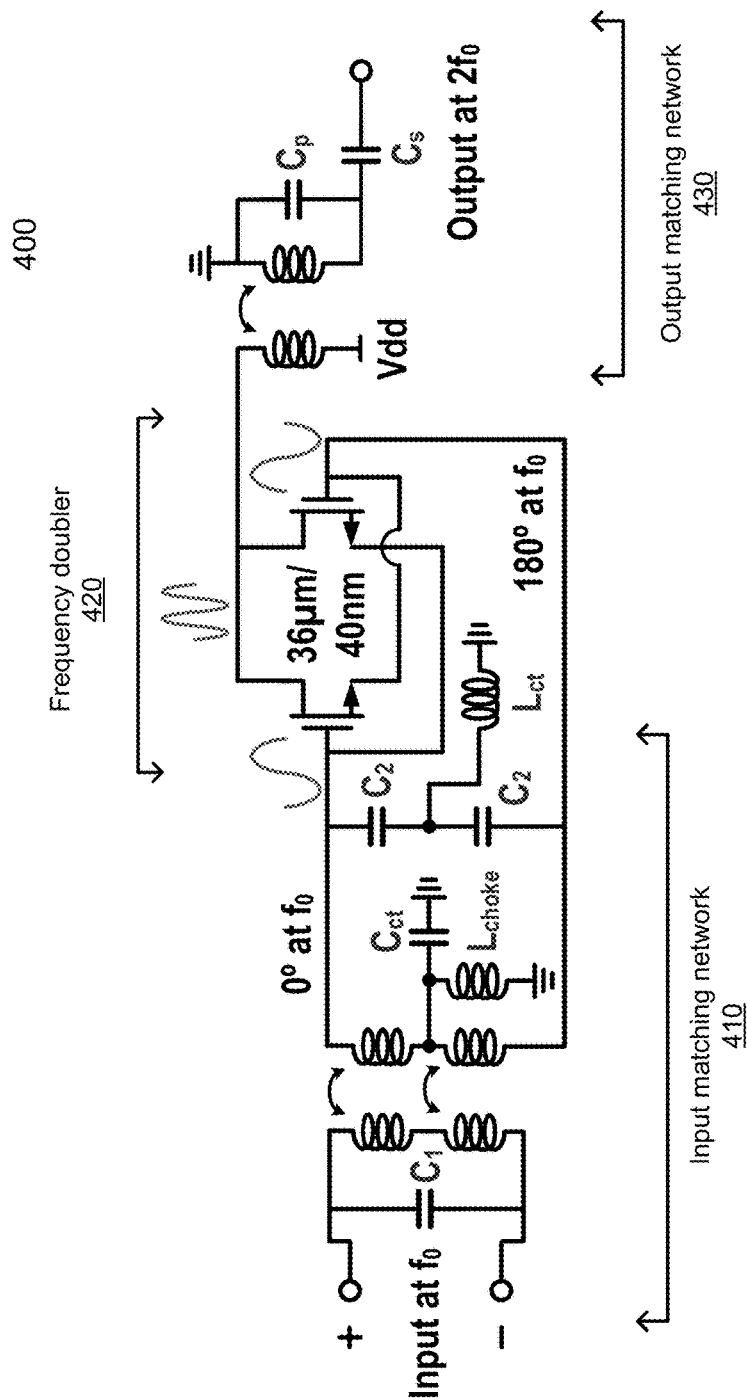
FIG. 4 is a block diagram illustrating an example of a frequency doubler integrated circuit according to one embodiment.

FIG. 4 is a block diagram illustrating an example schematic of a frequency doubler circuit according to one embodiment. Frequency doubler 400 can represent a frequency doubler included in converters such as converter 315 of FIG. 1 and frequency doubler 331 of FIG. 3B. Frequency doubler 400 includes input matching network 410, frequency doubler 420, and output matching network 430. Frequency doubler 420 can input a signal having a fundamental frequency and output a signal with frequency doubled the fundamental frequency, e.g., a second order harmonic frequency. Frequency doubler 420 includes a pair of field effect transistors in a balanced topology. The pair of field effect transistors are operated in nonlinear regions to produce distortions, e.g., higher order harmonics or frequency components at integer multiples of the frequency of the anti-phase input signals driving the pair of field effect transistors.

An output matching network such as output matching network 430 can be tuned to a second order harmonic of the fundamental frequency for frequency doubling (e.g., a passband filter at the second harmonic frequency). Output matching network 430 can also provide the second order harmonic load-pull impedance of the frequency doubler 420 to maximize the second order harmonic power at the output of frequency doubler 420. Input matching network 410 can match the input impedance to optimize a conversion gain at the input of frequency doubler 420 and to provide a wideband second harmonic trap (e.g., bandstop filter) to prevent second order harmonic signals from feeding back through $C_{gd}$ (a capacitance between gate and drain terminals of field effect transistors, due to overlap of the gate and deletion regions and/or silicon underneath the gate, acting as a feedback loop from the drain to the gate terminals) (not shown) of frequency doubler 420. Bandstop/notch filter or trap is a circuit that can filter out signals in some frequency ranges.

Frequency doubler 420 may include any types of transistors, for example, metal oxide semiconductor field effect transistors (MOSFET), bipolar junction transistors, quantum field effect transistors, etc. MOSFET is a voltage controlled field effect transistor that has a "Metal Oxide" gate terminal electrically insulated from a semiconductor n-channel or p-channel by a very thin layer of insulating material (e.g., silicon dioxide) to control current flow between a drain and a source terminal of the n-channel or p-channel. The electrically insulated gate terminal has a very high resistance, typically in the orders of mega-ohms. In one embodiment, frequency doubler 420 includes n-channel MOSFETS. In another embodiment, frequency doubler 420 includes p-channel MOSFETS.

Bipolar junction transistor (BJT) is a semiconductor device constructed with three doped Semiconductor Regions (base, collector and emitter) separated by two p-n Junctions. BJT is a current controlled transistor. Similar to a drain terminal of a MOFSET, a current applied at the base controls a current flow through the two p-n junctions (e.g., from collector to emitter regions). The base, collector, and emitter regions correspond respectively to gate, drain, and source terminals of a MOSFET. In some embodiments, frequency doubler 420 may include NPN transistors. In another embodiment, frequency doubler 420 may include PNP transistors. NPN is one of the two types of bipolar transistors, consisting of a layer of P-doped semiconductor (the "base") between two N-doped layers (the "collector" and "emitter"). PNP is the other type of bipolar transistors, consisting of a layer of N-doped semiconductor (the "base") between two N-doped layers (the "collector" and "emitter").

Figure 5:
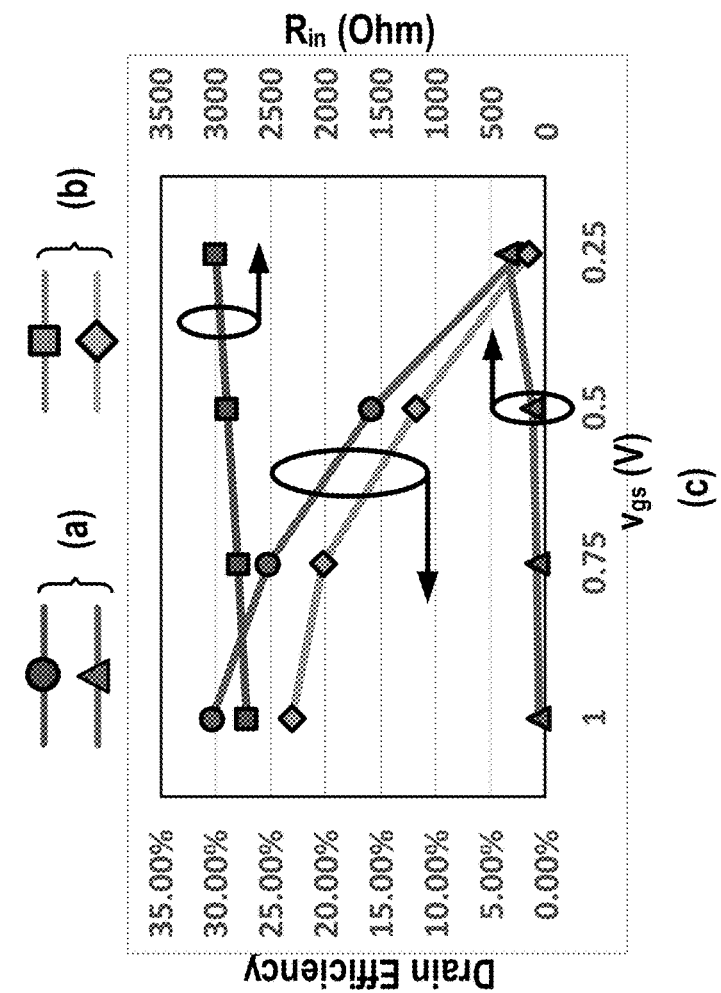
FIG. 5 illustrates (a) a block diagram of an example frequency doubler circuit according to one embodiment, (b) a block diagram of a conventional frequency doubler circuit, and (c) simulated drain efficiency and input impedance graphs of the circuits of (a) and (b).
Figure 5:
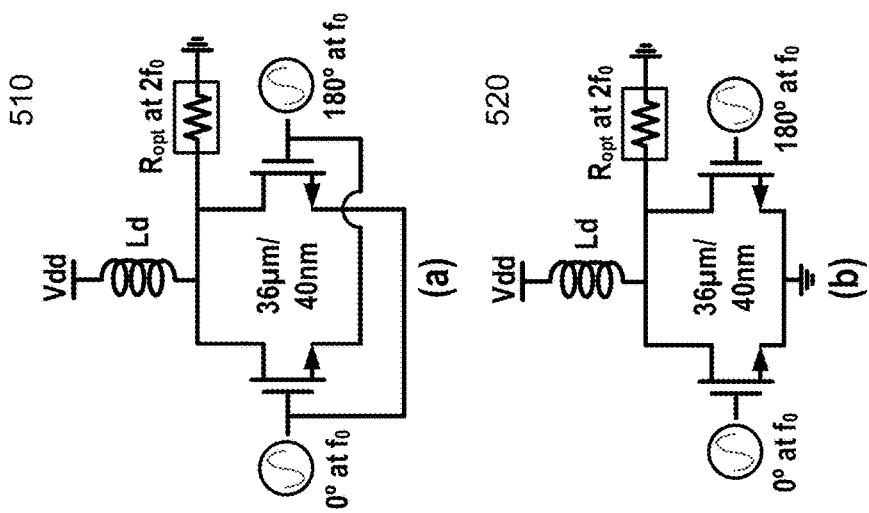

FIG. 5 illustrates (a) a block diagram of an example frequency doubler circuit according to one embodiment, (b) a block diagram of a conventional frequency doubler circuit, and (c) simulated drain efficiency and input impedance graphs of the circuits of (a) and (b). Referring to FIG. 5(b), circuit 520 represents a frequency doubler with a conventional driving scheme. Circuit 520 has a balanced topology with the sources of the transistors grounded. The gates of the transistors are driven by out of phase signals to generate a second harmonic signal at the drain outputs. Referring to FIG. 5(a), frequency doubler 510 is also based on a balanced topology but the gates and sources of the transistors are simultaneously driven by out of phase signals. Frequency doubler 510 can represent frequency doubler 420 of FIG. 4.

In this example, according to one embodiment, frequency doubler 510 includes a first field effect transistor (or transistor) having a first gate, a first drain, and a first source, and a second transistor having a second gate, a second drain, and a second source. The first gate of the first transistor and the second source of the second transistor are driven by a signal in a first phase, and the first source of the first transistor and the second gate of the second field effect transistor are driven by the signal in a second phase. In another embodiment, the first and the second phases are out of phase by approximately 180 degrees. In one embodiment, frequency doubler 510 is biased at a Class-C region, e.g., approximately 0 volts gate voltage with VDD equal to approximately 1 volt. The input signal applied to frequency double 510 has a peak to peak voltage of 1 volt.

In one embodiment, the first and the second transistors of frequency doubler 510 has transistor widths of 36 um (micrometers) and transistor gate lengths of 40 nanometers (nm). The frequency doubler 510 can be designed in a 45 nm silicon on insulator (SOI) CMOS fabrication process. In some embodiments, frequency doubler 510 is designed in other CMOS fabrication processes, such as 22 nm, 32 nm, 65 nm, 90 nm, or 130 nm SOI CMOS technologies. Because the input impedance of frequency doubler 510 is a parallel combination of the impedance looking into the gate (e.g., high impedance) and that looking into the source (e.g., 1/gm, low impedance), therefore, frequency doubler 510 has a low input impedance in comparison with conventional frequency doubler 520 of FIG. 5(b). The lower input impedance can greatly reduce the impedance transformation ratio of an input matching network minimizing a loss due to input matching and/or conversion gain. Furthermore, a maximum harmonic output power is achieved when the output of frequency doubler 510 is terminated by an optimum load, $R_{opt}$ (=$V_{DD}/i_{2nd}$), at the second order harmonic frequency.

Referring to FIG. 5(c), the graph shows drain efficiencies and input impedances for frequency doubler circuits of FIGS. 5(a)-5(b). In both cases, the load is terminated by an optimum $R_{opt}$ with $L_d$ resonating out the output parasitic capacitances. Moreover, the RF voltage swing between the transistor gate and source (e.g., $v_{gs}$) is kept below approximately 1 volt for reliability considerations. As shown in FIG. 5(c), the drain efficiency $\eta(=P_{out}/P_{DC})$ of the frequency doubler 510 is enhanced by a factor of about 1.3 times in comparison with conventional frequency doubler 520 when $v_{gs}$ equals approximately 1 volts. In addition, the input impedance is reduced by about 45 times from approximately 2.7 kΩ to approximately 60Ω, which significantly eases the input matching design and improves the doubler conversion gain.

Figure 6A:
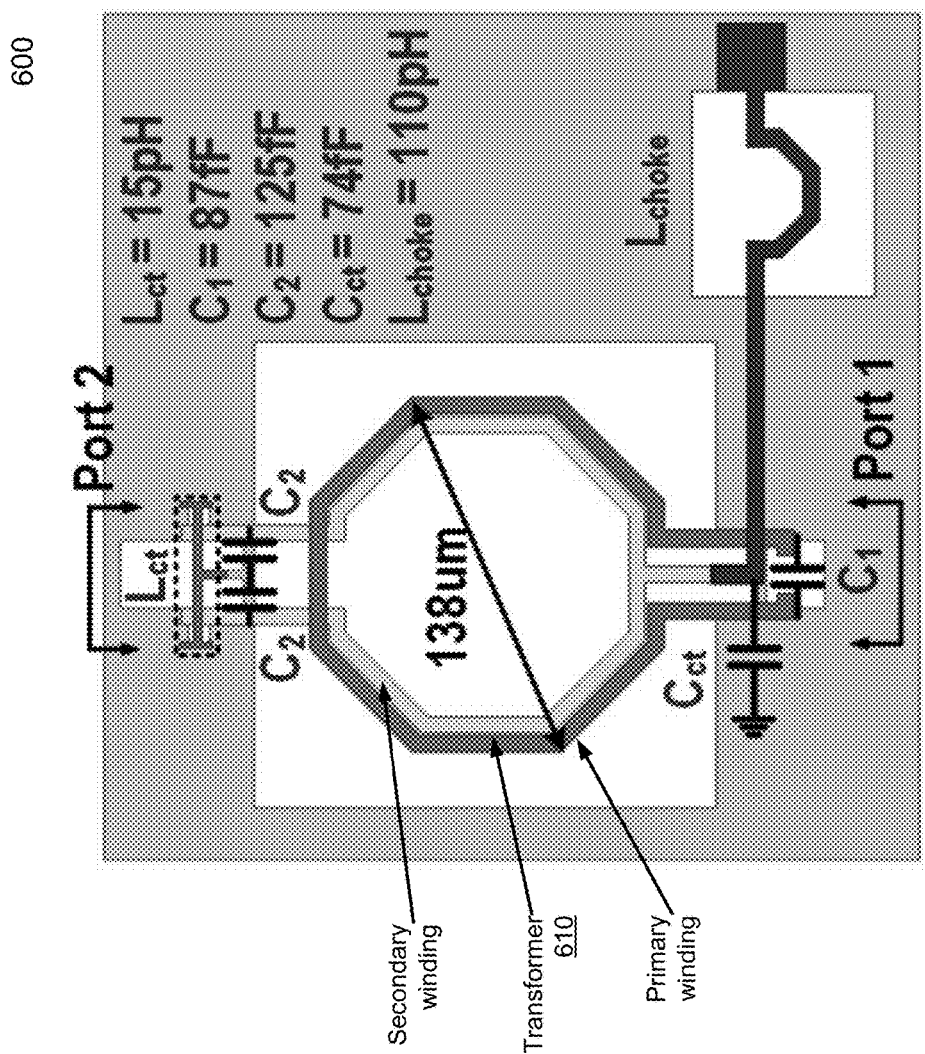
FIG. 6A is a top view of an EM model of an input matching network according to one embodiment.
Figure 6B:
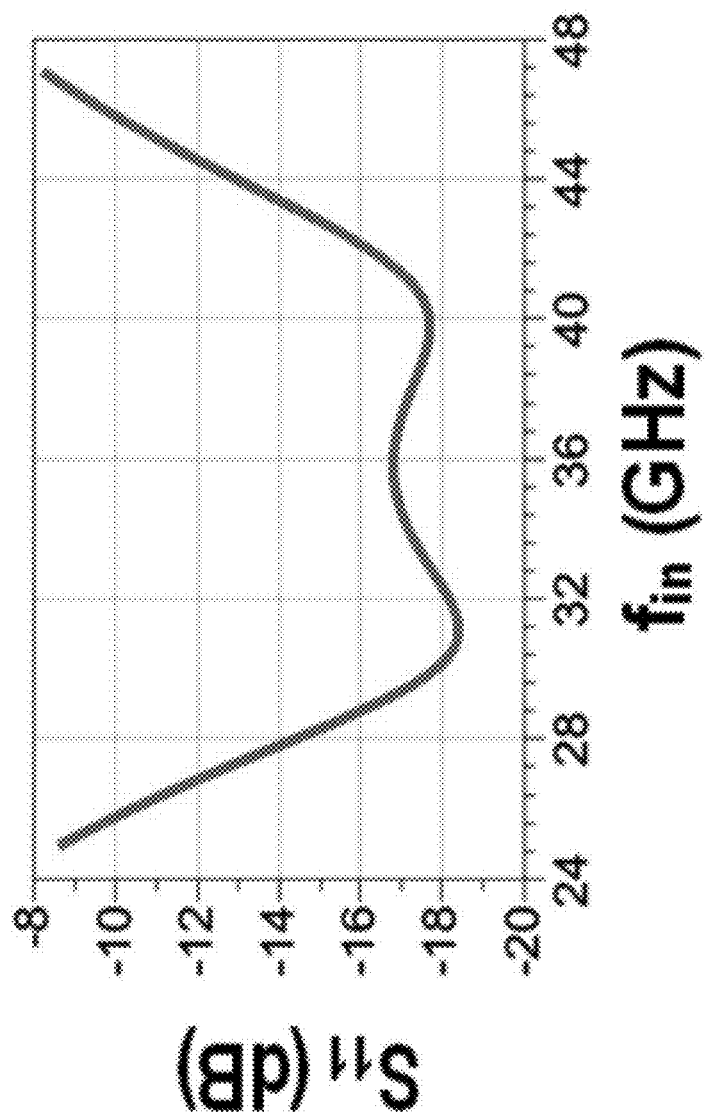
FIG. 6B is a S11 scattering parameter of the input matching network of FIG. 6A.
Figure 6C:
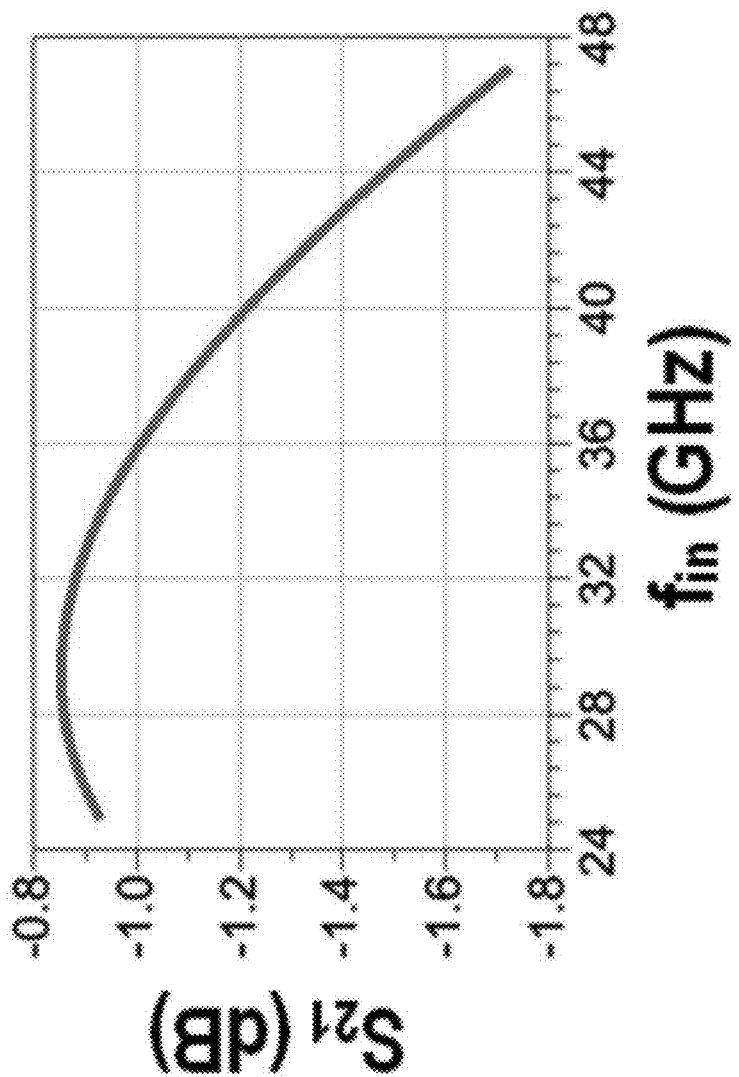
FIG. 6C is a S21 scattering parameter of the input matching network of FIG. 6A.
Figure 6D:
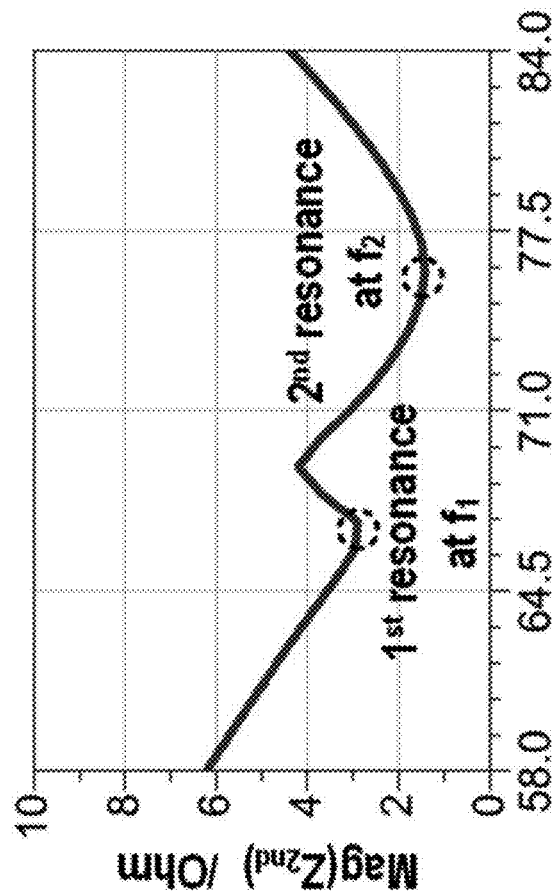
FIG. 6D is an exemplary smith chart and impedance graphs of the input matching network (as seen by the frequency doubler input) of FIG. 6A.
Figure 6D:
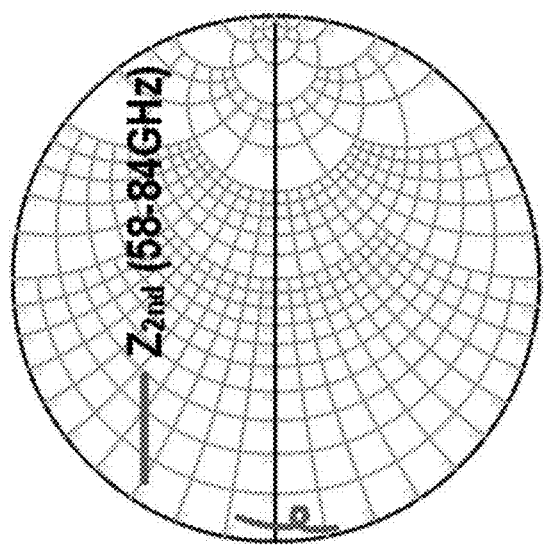

FIG. 6A is a top view of an EM model of an input matching network according to one embodiment. FIG. 6B is a S11 scattering parameter of the input matching network of FIG. 6A. FIG. 6C is a S21 scattering parameter of the input matching network of FIG. 6A. FIG. 6D is an exemplary smith chart and impedance graphs of the input matching network (as seen by an input of a frequency doubler such as frequency doubler 420 of FIG. 4) of FIG. 6A. Referring to FIG. 6A, input matching network 600 can represent input matching network 410 of FIG. 4. Input matching network 600 includes transformer 610, capacitances $C_1$, $C_2$, $C_{ct}$, and inductances $L_{ct}$ and $L_{choke}$. Referring to FIG. 6A, in one embodiment, transformer 610 can be integrated on the silicon chip as polygonal primary and the secondary windings of approximately 138 micrometers in diameter, with a turn ratio of 1:1. In some embodiments, the primary and the secondary windings of transformer 610 can be in any shapes or sizes with any turn ratios. Capacitances $C_1$ and $C_2$ are used for input impedance matching to a frequency doubler circuit such as frequency doubler 420 of FIG. 4. Capacitances can be integrated on the silicon chip as an oxide layer (or any non-conductive layer) sandwiched between two electrically conductive layers. The capacitances can be in a vertical (between two or more vertical layers) or a horizontal (printed on one vertical layer) plane. $L_{choke}$ provides DC biasing for the gates of the transistors of the frequency double. $L_{choke}$ can be integrated on the silicon chip as a spiral line, as illustrated in FIG. 6A. Besides input matching, an input network can also provide a wideband second order harmonic trap (or bandstop/notch filter) to filter out frequency signals surrounding the second order harmonic frequency generated by a frequency doubler. The wideband second order harmonic trap minimizes second order harmonic feedbacks through $C_{gd}$ of the transistors of the frequency doubler. In one embodiment, a dual resonance is created to expand the bandwidth of the second order harmonic trap. $C_{ct}$ is used to resonate with a common-mode inductance of transformer 610 to form a first resonance at frequency $f_1$ (as shown in FIG. 6D). Moreover, $L_{ct}$ resonates with $C_2$, to form second resonance at frequency $f_2$ (as shown in FIG. 6D).

Referring to FIG. 6D, it can be seen that the magnitude of the second order harmonic impedance is below approximately 6Ω from approximately 58 to 84 GHz, which makes it possible to achieve a broadband high-efficiency frequency doubling operation. Referring to FIG. 6A, since the center taps on the secondary winding of transformer 610 and the two capacitors ($C_2$) are virtual grounds in differential mode, neither $C_{ct}$ nor $L_{ct}$ affects the fundamental matching. By offsetting the two resonance (e.g., $f_1$ and $f_2$) frequencies, a wideband second order harmonic trap is created at the input of a frequency doubler circuit. Referring to FIGS. 6B-6C, the $S_{11}$ scattering parameter (or reflection coefficient) bandwidth at −10 dB ranges from approximately 25 to 47 GHz, and the $S_{21}$ scattering parameter (or transmission coefficient) varies from −0.85 to −1.6 dB for the respective frequency range demonstrate a wideband input matching.

Figure 7A:
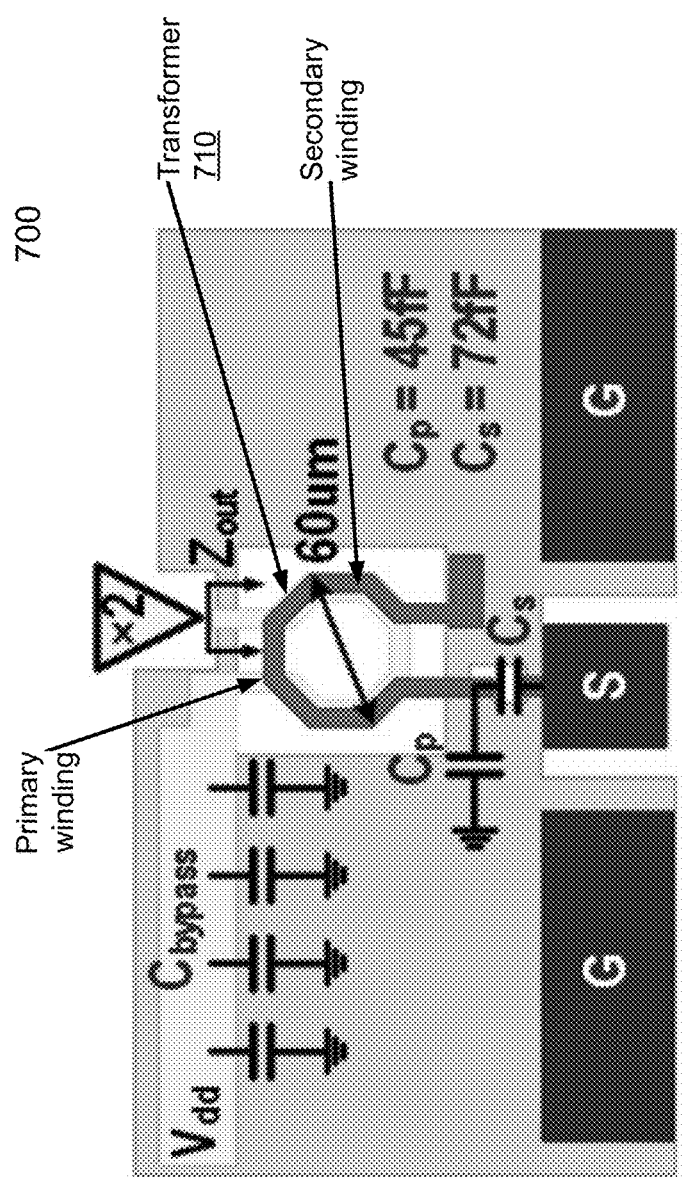
FIG. 7A is a top view of an EM model of an output matching network according to one embodiment.

FIG. 7A is a top view of an EM model of an output matching network according to one embodiment. FIGS. 7B and 7C are exemplary real and imaginary impedance graphs of the output matching network (as seen by the output of a frequency double such as frequency doubler 420 of FIG. 4) of FIG. 7A. Referring to FIG. 7A, output impedance network 700 can represent output impedance network 430 of FIG. 4. Output impedance network 700 includes transformer 710, and capacitances $C_s$ and $C_p$. As shown in FIG. 7A, in one embodiment, transformer 710 can be implemented onboard with polygonal primary and the secondary windings approximately 60 micrometers in diameters, with a turn ratio of 1:1. In some embodiments, the primary and the secondary windings of transformer 710 can be in any shapes or sizes with any turn ratios. In this scenario, transformer 710, and capacitances $C_s$ and $C_p$ can match the output impedance to the desired second order harmonic impedance of a frequency doubler such as frequency doubler 420 of FIG. 4. Transformer 710 can also source a $V_{DD}$ supply for a frequency doubler such as frequency doubler 420 of FIG. 4. Referring to FIGS. 7B-7C, the graphs show a real and an imaginary component of impedance seen by a frequency doubler. As shown in FIGS. 7B-7C, a close to $R_{opt}$ impedance is maintained over frequency ranges from approximately 55 to 85 GHz.

Figure 8:
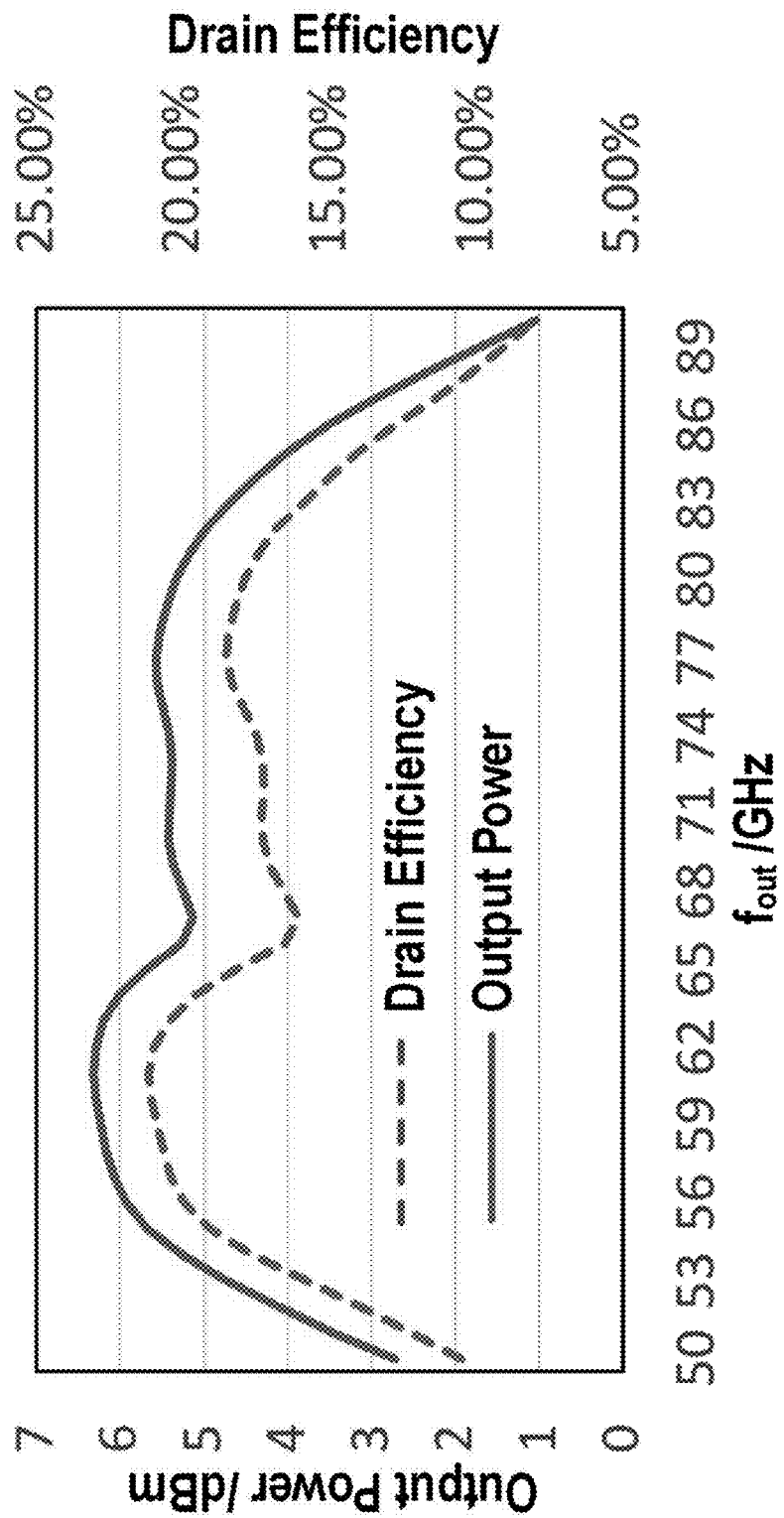
FIG. 8 is a block diagram illustrating an output power and a drain efficiency graphs for a frequency doubler circuit according to one embodiment.

FIG. 8 is a block diagram illustrating an output power and a drain efficiency graphs for frequency doubler circuit 400 of FIG. 4. Referring to FIG. 8, the frequency doubler circuit 400 has a peak output power of approximately 6.3 dBm with a drain efficiency of approximately 22%. Frequency doubler circuit 400 has a 3 dB bandwidth from approximately 51 to 86 GHz, corresponding to approximately 51% fractional bandwidth (FBW). The drain efficiency is maintained over 15% within the bandwidth, demonstrating a wideband high-efficiency frequency doubling operation.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A radio frequency (RF) integrated circuit, comprising:
a RF transceiver to transmit and receive RF signals;
a frequency synthesizer coupled to the RF transceiver to perform frequency synthesis,
wherein the frequency synthesizer includes:
a local oscillator (LO) to generate a LO signal,
a frequency doubler circuit coupled to the LO to double a frequency of the LO signal, the frequency doubler circuit including:
a first field effect transistor having a first gate, a first source, and a first drain; and
a second field effect transistor having a second gate, a second source, and a second drain, wherein the first gate of the first field effect transistor and the second source of the second field effect transistor are driven by an input signal in a first phase, wherein the first source of the first field effect transistor and the second gate of the second field effect transistor are driven by the input signal in a second phase, wherein the first field effect transistor and the second field effect transistor are caused to switch based on the first phase and the second phase of the input signal respectively to generate an output signal at the first drain and the second drain having a frequency that is approximately double of the input signal.

2. The RF integrated circuit of claim 1, wherein the first and the second phases are approximately 180 degrees apart.

3. The RF integrated circuit of claim 1, wherein the frequency doubler circuit further comprises an input matching network coupled to the first and the second field effect transistors.

4. The RF integrated circuit of claim 3, wherein the input matching network comprises a first transformer having a primary and a secondary windings, wherein the primary winding is coupled to an input port, wherein a first end of the secondary winding is coupled to the first gate of the first field effect transistor and the second source of the second field effect transistor, and a second end of the secondary winding is coupled to the first source of the first field effect transistor and the second gate of the second field effect transistor.

5. The RF integrated circuit of claim 4, wherein the input matching network comprises a first capacitance coupled to a center tap of the secondary winding of the first transformer and configured to induce a first resonant frequency with a common-mode inductance of the first transformer.

6. The RF integrated circuit of claim 5, wherein the input matching network comprises a inductance-capacitance network coupled to the secondary winding of the first transformer and configured to induce a second resonant frequency, wherein the first and the second resonant frequencies forms an operating bandwidth of the frequency doubler circuit.

7. The RF integrated circuit of claim 3, wherein the frequency doubler circuit further comprises an output matching network coupled to the first and the second drains of the first and the second field effect transistors respectively.

8. The RF integrated circuit of claim 7, wherein the output matching network comprises a second transformer having a primary and a secondary windings, wherein the primary winding is coupled between a DC biasing source and the first and the second drains of the first and the second field effect transistors respectively, and the secondary winding of the second transformer is coupled to an output port via a fourth capacitance.

9. The RF integrated circuit of claim 8, wherein the output matching network comprises a fifth capacitance in parallel to the secondary winding of the second transformer.

10. A frequency doubler circuit comprising:
a first field effect transistor having a first gate, a first source, and a first drain; and
a second field effect transistor having a second gate, a second source, and a second drain, wherein the first gate of the first field effect transistor and the second source of the second field effect transistor are driven by an input signal in a first phase, wherein the first source of the first field effect transistor and the second gate of the second field effect transistor are driven by the input signal in a second phase, wherein the first field effect transistor and the second field effect transistor are caused to switch based on the first phase and the second phase of the input signal respectively to generate an output signal at the first drain and the second drain having a frequency that is approximately double of the input signal.

11. The frequency doubler circuit of claim 10, wherein the first and the second phases are approximately 180 degrees apart.

12. The frequency doubler circuit of claim 10, further comprising an input matching network coupled to the first and the second field effect transistors.

13. The frequency doubler circuit of claim 12, wherein the input matching network comprises a first transformer having a primary and a secondary windings, wherein the primary winding is coupled to an input port, wherein a first end of the secondary winding is coupled to the first gate of the first field effect transistor and the second source of the second field effect transistor, and a second end of the secondary winding is coupled to the first source of the first field effect transistor and the second gate of the second field effect transistor.

14. The frequency doubler circuit of claim 13, wherein the input matching network comprises a first capacitance coupled to a center tap of the secondary winding of the first transformer and configured to induce a first resonant frequency with a common-mode inductance of the first transformer.

15. The frequency doubler circuit of claim 14, wherein the input matching network comprises a inductance-capacitance network coupled to the secondary winding of the first transformer and configured to induce a second resonant frequency, wherein the first and the second resonant frequencies forms an operating bandwidth of the frequency doubler circuit.

16. The frequency doubler circuit of claim 12, further comprising an output matching network coupled to the first and the second drains of the first and the second field effect transistors respectively.

17. The frequency doubler circuit of claim 16, wherein the output matching network comprises a second transformer having a primary and a secondary windings, wherein the primary winding is coupled between a DC biasing source and the first and the second drains of the first and the second field effect transistors respectively, and the secondary winding of the second transformer is coupled to an output port via a fourth capacitance.

18. The frequency doubler circuit of claim 17, wherein the output matching network comprises a fifth capacitance in parallel to the secondary winding of the second transformer.

19. A wireless communication device comprising:
a baseband processor;
an RF integrated circuit coupled to the baseband processor, the RF integrated circuit comprising:

a RF transceiver to transmit and receive RF signals;
a frequency synthesizer coupled to the RF transceiver to perform frequency synthesis, wherein the frequency synthesizer includes:
  a local oscillator (LO) to generate a LO signal,
  a frequency doubler circuit coupled to the LO to double a frequency of the LO signal, the frequency doubler circuit including:
    a first field effect transistor having a first gate, a first source, and a first drain; and
    a second field effect transistor having a second gate, a second source, and a second drain, wherein the first gate of the first field effect transistor and the second source of the second field effect transistor are driven by an input signal in a first phase, wherein the first source of the first field effect transistor and the second gate of the second field effect transistor are driven by the input signal in a second phase, wherein the first field effect transistor and the second field effect transistor are caused to switch based on the first phase and the second phase of the input signal respectively to generate an output signal at the first drain and the second drain having a frequency that is approximately double of the input signal.

20. The wireless communication device circuit of claim 19, wherein the frequency doubler circuit further comprises an input matching network coupled to the first and the second field effect transistors.

* * * * *